United States Patent
Ainspan et al.

(10) Patent No.: US 9,231,605 B2
(45) Date of Patent: Jan. 5, 2016

(54) REMOVING DETERMINISTIC PHASE ERRORS FROM FRACTIONAL-N PLLS

(71) Applicant: INTERNATIONAL BUSINESS MACHINES CORPORATION, Armonk, NY (US)

(72) Inventors: Herschel A. Ainspan, New Hempstead, NY (US); Mark A. Ferriss, Tarrytown, NY (US); Daniel J. Friedman, Sleepy Hollow, NY (US); Alexander V. Rylyakov, Mount Kisco, NY (US); Bodhisatwa Sadhu, White Plains, NY (US); Alberto Valdes Garcia, Hartsdale, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/498,438

(22) Filed: Sep. 26, 2014

(65) Prior Publication Data

US 2015/0200677 A1    Jul. 16, 2015

Related U.S. Application Data

(60) Provisional application No. 61/926,028, filed on Jan. 10, 2014.

(51) Int. Cl.
*H03L 7/06* (2006.01)
*H03L 7/099* (2006.01)
(Continued)

(52) U.S. Cl.
CPC .............. *H03L 7/0992* (2013.01); *H03L 7/085* (2013.01); *H03L 7/1974* (2013.01)

(58) Field of Classification Search
USPC .................................. 327/147–149, 156–158
See application file for complete search history.

(56) References Cited

U.S. PATENT DOCUMENTS

| | | |
|---|---|---|
| 5,038,117 A | 8/1991 | Miller |
| 5,162,723 A | 11/1992 | Marzalek et al. |

(Continued)

FOREIGN PATENT DOCUMENTS

| | | |
|---|---|---|
| EP | 1164701 A2 | 12/2001 |
| JP | 2007124267 A | 5/2007 |

(Continued)

OTHER PUBLICATIONS

Curtin, M., et al."Phase-Locked Loops for High-Frequency Receivers and Transmitters-Part 1", Analog Dialogue. Mar. 1999. vol. 33. No. 3. pp. 1-14.

(Continued)

*Primary Examiner* — Adam Houston
(74) *Attorney, Agent, or Firm* — Tutunjian & Bitetto, P.C.; Anne V. Dougherty

(57) ABSTRACT

Methods and devices for phase adjustment include a phase detector that is configured to compare a reference clock and a feedback clock and to generate two output signals. A difference in time between pulse widths of the two output signals corresponds to a phase difference between the reference clock and the feedback clock. A programmable delay line is configured to delay an earlier output signal in accordance with a predicted deterministic phase error. An oscillator is configured to generate a feedback signal in accordance with the delayed output signal. A divider is configured to divide a frequency of the oscillator output by an integer N. The integer N is varied to achieve an average fractional divide ratio and the predicted deterministic phase error is based on the average divide ratio and an instantaneous divide ratio.

20 Claims, 5 Drawing Sheets

(51) Int. Cl.
*H03L 7/085* (2006.01)
*H03L 7/197* (2006.01)

(56) References Cited

U.S. PATENT DOCUMENTS

| | | | |
|---|---|---|---|
| 7,002,384 B1* | 2/2006 | Chong et al. | 327/158 |
| 7,605,665 B2 | 10/2009 | Chambers et al. | |
| 7,755,443 B2 | 7/2010 | Osman et al. | |
| 8,396,096 B2 | 3/2013 | Noel et al. | |
| 2003/0062959 A1* | 4/2003 | Tsuda et al. | 331/17 |
| 2004/0164809 A1* | 8/2004 | Gibbs | 331/1 A |
| 2005/0008113 A1* | 1/2005 | Kokubo et al. | 375/376 |
| 2005/0017887 A1* | 1/2005 | Nagaso et al. | 341/143 |
| 2007/0002993 A1 | 1/2007 | Wang et al. | |
| 2007/0069780 A1* | 3/2007 | Kim | 327/158 |
| 2008/0181347 A1* | 7/2008 | Nakamura | 375/362 |
| 2010/0123488 A1 | 5/2010 | Palmer et al. | |
| 2010/0188158 A1 | 7/2010 | Ainspan et al. | |
| 2010/0264963 A1* | 10/2010 | Kikuchi et al. | 327/157 |
| 2012/0133401 A1* | 5/2012 | Tsuda | 327/147 |
| 2012/0139587 A1 | 6/2012 | Drago et al. | |
| 2012/0242383 A1 | 9/2012 | Elad et al. | |
| 2013/0009679 A1 | 1/2013 | Sindalovsky et al. | |
| 2013/0271186 A1 | 10/2013 | Hossain et al. | |
| 2014/0292426 A1* | 10/2014 | Maki | 331/94.1 |
| 2015/0200677 A1* | 7/2015 | Ainspan et al. | 327/158 |

FOREIGN PATENT DOCUMENTS

| | | |
|---|---|---|
| WO | WO 00/21197 A1 | 4/2000 |
| WO | WO 2010/056840 A1 | 5/2010 |

OTHER PUBLICATIONS

Ferriss, M. et al. "A 28GHZ Hybrid PLL in 32NM SOI CMOS" Jun. 2013. pp. 1-2.

Huang, D., "A Fast-Locked All-Digital Phased-Locked Loop Using Successive-Approximation Frequency-Search Algorithm" Apr. 2012.

Lee, I., "A 4.8-GHZ Dividerless Subharmonically Injection-Locked All-Digital PLL With a FOM of-252.5 DB" IEEE Transactions on Circuits and Systems-II: Express Briefs. Feb. 2013. pp. 1-5.

Obote, S., et al. "Novel Fractional-N PLL Frequency Synthesizer With Reduced Phase Error" IEEE Asia Pacific Conference on Circuits and Systems. Nov. 1996. pp. 45-48.

Perrott, M., "A Modeling Approach for_-_Fractional-N Frequency Synthesizers Allowing Straightforward Noise Analysis" IEEE Journal of Solid-State Circuits. Aug. 2002. vol. 37. No. 8. pp. 1028-1038.

Sadhu, B., et al. "A Linearized, Low-Phase-Noise VCO-Based 25-GHZ PLL With Autonomic Biasing" IEEE Journal of Solid-State Circuits. May 2013. vol. 48. No. 5. pp. 1138-1150.

Straayer, M., "A Multi-Path Gated Ring Oscillator TDC With First-Order Noise Shaping" IEEE Journal of Solid-State Circuits. Apr. 2009. Vol. 44, No. 4. pp. 1089-1098.

"List of IBM Patents or Patent Applications Treated as Related".

* cited by examiner

REMOVING DETERMINISTIC PHASE ERRORS FROM FRACTIONAL-N PLLS

CROSS REFERENCE TO RELATED APPLICATIONS

This application claims priority to provisional application Ser. No. 61/926,028 filed Jan. 10, 2014, incorporated herein by reference in its entirety.

STATEMENT REGARDING FEDERALLY SPONSORED RESEARCH OR DEVELOPMENT

This invention was made with Government support under Contract No.: HR0011-12-C-0087 awarded by Defense Advanced Research Projects Agency (DARPA). The Government has certain rights to this invention.

BACKGROUND

1. Technical Field

The present invention relates to phase locked loops and, more particularly, to removing deterministic phase error from fractional-N analog phase locked loops.

2. Description of the Related Art

Phase locked loops (PLLs) are components in many systems, e.g., microprocessors, millimeter-wave radios, and serial links. A fractional-N PLL is a PLL which generates an output frequency having a non-integer or fractional ratio to the input reference frequency. A fractional-N PLL typically achieves this by modulating the division ratio of the PLL's feedback divider in integer steps, so as to achieve an average fractional (non-integer) net division ratio.

Conventional analog fractional-N PLLs use linear charge pumps and analog loop filters. Converting a PLL from an integer-N to fractional-N typically comes at a price of degrading the phase noise and jitter performance of the PLL. In conventional fractional-N PLLs, deterministic noise is added to the PLL, which results in a degradation in phase noise and jitter performance. Previous attempts to remove this deterministic noise have utilized analog intensive cancellation schemes that are difficult to implement in manufacturing processing optimized for designs with significant digital content.

One example of deterministic phase error subtraction involves the use of current digital analog converters (DACs) to subtract sigma-delta noise from the loop filter. However, it is difficult to match the gain of the DAC to the gain of the charge pump. Typically, a slow least-means-squared based calibration scheme is used to calibrate the gain of the cancellation path. DACs are large, inflexible, and slow to calibrate. In another example, a gated ring oscillator is used as a part of a time-to-digital converter, where the ring is frozen between measurements, such that quantization error is recycled. This latter approach results in high pass shaping of the quantization noise.

SUMMARY

A phase-locked loop includes a phase detector, configured to compare a reference clock and a feedback clock and to generate two output signals. A difference in time between pulse widths of the two output signals corresponds to a phase difference between the reference clock and the feedback clock. A programmable delay line is configured to delay an earlier output signal in accordance with a predicted deterministic phase error. An oscillator is configured to generate a feedback signal in accordance with the delayed output signal. A divider is configured to divide a frequency of the oscillator output by an integer N. The integer N is varied to achieve an average fractional divide ratio and the predicted deterministic phase error is based on the average divide ratio and an instantaneous divide ratio.

A phase correction method includes comparing a reference clock and a feedback clock to generate two output signals. A difference in time between pulse widths of the two signals corresponds to a phase difference between the reference clock and the feedback clock. The earlier output signal is delayed in accordance with a predicted deterministic phase error. A feedback signal is generated in accordance with the delayed output signal. A frequency of the feedback signal is divided by an integer N. The integer N is varied to achieve an average fractional divide ratio and the predicted deterministic phase error is based on the average divide ratio and an instantaneous divide ratio.

A phase correction method includes comparing a reference clock and a feedback clock to generate two output signals. A difference in time between pulse widths of the two signals corresponds to a phase difference between the reference clock and the feedback clock. The earlier output signal is delayed by a programmable delay in accordance with a predicted deterministic phase error. The later signal is delayed by a fixed delay that corresponds to a minimum programmable delay for the earlier signal. A feedback signal is generated in accordance with the delayed output signal. A frequency of the feedback signal is divided by an integer N. The integer N is varied to achieve an average fractional divide ratio and wherein the predicted deterministic phase error is based on the average divide ratio and an instantaneous divide ratio. Delaying the earlier output signal includes triggering a ring of delay units, counting a number of cycles of the ring of delay units, providing a delayed output signal after a number of cycles that corresponds with the predicted deterministic phase error. Output signals from a last delay unit are provided as inputs to a first delay unit.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Embodiments of the present invention enable the subtraction of the deterministic component of noise from fractional-N phase-locked loops (PLLs). To accomplish this, the present embodiments perform noise cancellation in the time domain before a charge pump, such that no matching of currents with the charge pump is needed. The present embodiments employ a ring oscillator which, contrary to conventional gated-ring-oscillator based cancellation schemes, does not need an analog integrator. Integration associated with noise shaping is instead performed in the digital domain.

Figure 1:
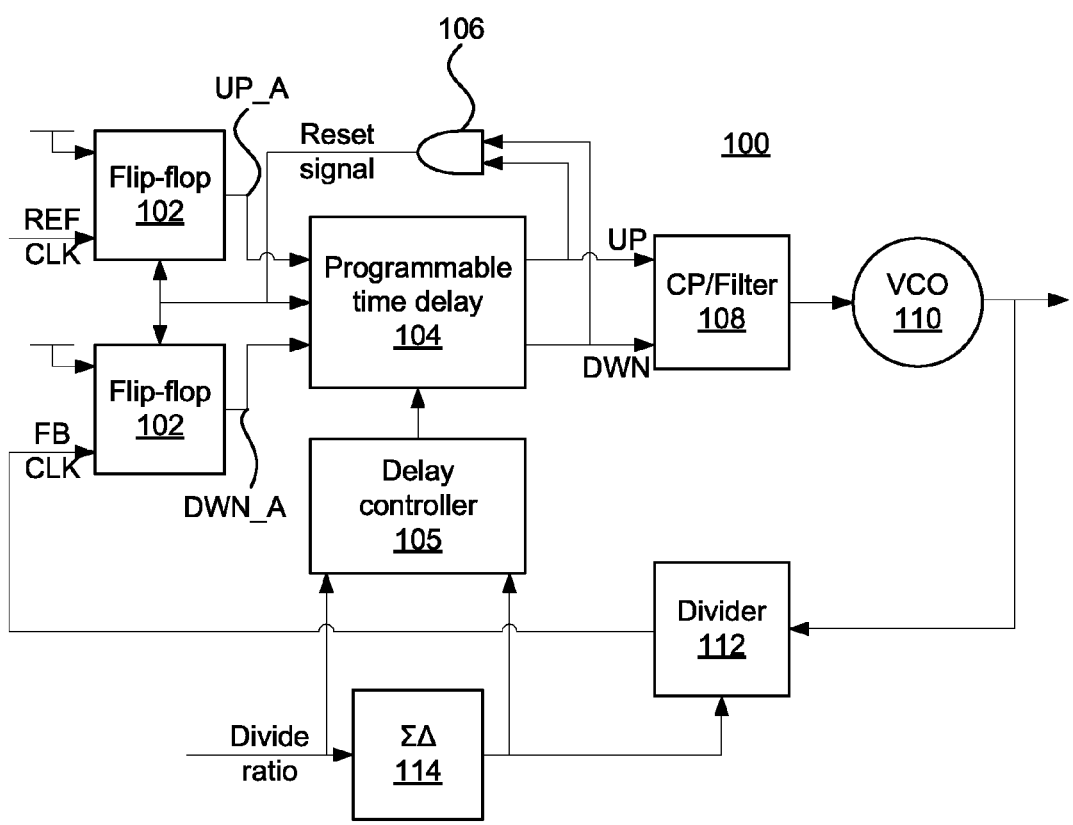
FIG. 1 is a block diagram of an analog fractional-N phase-locked loop with a delay module in accordance with the present principles.

Referring now to the drawings in which like numerals represent the same or similar elements and initially to FIG. 1, a fractional-N PLL 100 is shown. A reference clock and a feedback clock are provided to respective flip-flops 102. The output of each flip-flop 102 goes high in response to the rising edge of that flip-flop's input. These flip-flops 102 form part of a phase detector, where the time difference between the pulse durations of the two outputs represents the difference in arrival times of the rising edges of the two inputs. When both signals are high, an AND gate 106 triggers a reset signal, which resets each flip-flop back to its logic low state.

A programmable time delay 104 serves to appropriately delay the outputs of the phase detector. This delay may be used to cancel the deterministic contribution to the phase noise caused by the fractional-N PLL's sigma-delta module 114, which controls the divider 112 according to a provided target divide ratio. The sigma-delta module 114 provides a changing integer division that averages out to match the divide ratio. For example, to achieve a divide ratio of 4.5, the sigma-delta module 114 may cause the divider 112 to alternate between a value of 4 and a value of 5. This causes a large but predictable phase error in the loop. The removal of the relatively large deterministic phase noise allows phase correction to be performed without the need for a high-resolution time-to-digital converter. It is furthermore contemplated that the present principles may be readily extended to other PLL architectures, including digital, analog, and hybrid architectures. The UP and DOWN signals provided by the programmable time delay 104 are provided to a charge pump/filter 108, which applies a corresponding phase correction and controls the voltage controlled oscillator (VCO) 110 to produce a phase corrected output signal.

The programmable delay 104 may be formed from digital components, making it easier to implement the present embodiments in digitally oriented complementary metal oxide semiconductor (CMOS) processes. The gain needed for the cancellation path is independent of the size of the charge pump current or loop filter impedance. This makes it more flexible in the sense that the dynamic range that the noise cancellation has to support is not affected by changes of the PLL loop bandwidth. It should be noted that, although the programmable delay 104 is positioned after the phase detector latches 102, the delay 104 may also be positioned in front of the input flip-flops 102, delaying the feedback and reference signals before the loop 100 determines their respective phases.

The size of the deterministic error to be removed from the loop is calculated in the digital domain, and the actual error in the PLL loop is in the analog domain (i.e., not quantized in time), which means that the cancellation problem is analogous to digital-to-analog conversion. This may be contrasted to time-to-digital conversion, which is an analog-to-digital problem at its heart. As a result, no analog integration is needed to implement quantization noise shaping in a digital-to-analog converter. In contrast, noise shaping in an analog-to-digital converter needs some form of analog integration.

Figure 2:
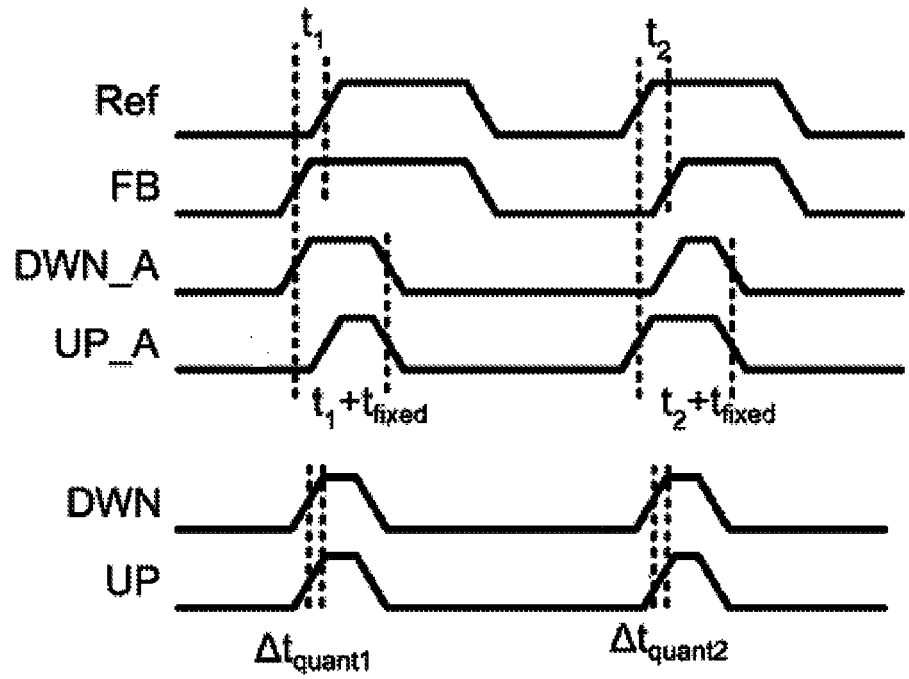
FIG. 2 is a diagram of different signals in an analog fractional-N phase-locked loop with a delay module in accordance with the present principles

Referring now to FIG. 2, a timing diagram is shown that illustrates the relative timing of pulses at various points in the loop 100. The reference clock (Ref) and feedback clock (FB) are shown, with timing differences between the leading edges of pulses in the respective clocks being shown as $t_1$ and $t_2$. In this case, the feedback clock leads the reference clock in a first cycle but trails in a second cycle. The phase detecting flip-flops 102 produce the DWN_A and UP_A signals, where the DWN_A signal is triggered by the rising edge of the feedback clock and the UP_A signal is triggered by the rising edge of the reference clock. After a fixed delay of $t_{fixed}$, determined by the reset time of the flip-flops 102, the two signals revert to a low state.

In this example, the phase error contribution of the sigma-delta module 114 is significantly larger than the actual phase error of the other components in the PLL. The error from the sigma-delta module 114 will cause one of the rising edges of UP_A or DWN_A to be earlier than the other by a deterministic amount. To compensate for this effect, the delay module 104 delays the earlier signal in DWN_A and UP_A. Only the rising edges of signals are delayed. Once both outputs are high, the reset signal is generated which simultaneously resets both outputs to zero. The difference in pulse widths of the programmable delay elements, DWN and UP, are still include the other source of PLL phase errors; only the deterministic component has been removed. The programmable time delay 104 itself will have a quantization limit of $\Delta t_{quant}$, which may be controlled with noise shaping. The quantization limit of the delay path is based on the delay through a single programmable delay element (e.g. a CMOS inverter), which is orders of magnitude smaller than the deterministic divider sigma-delta noise.

Figure 3:
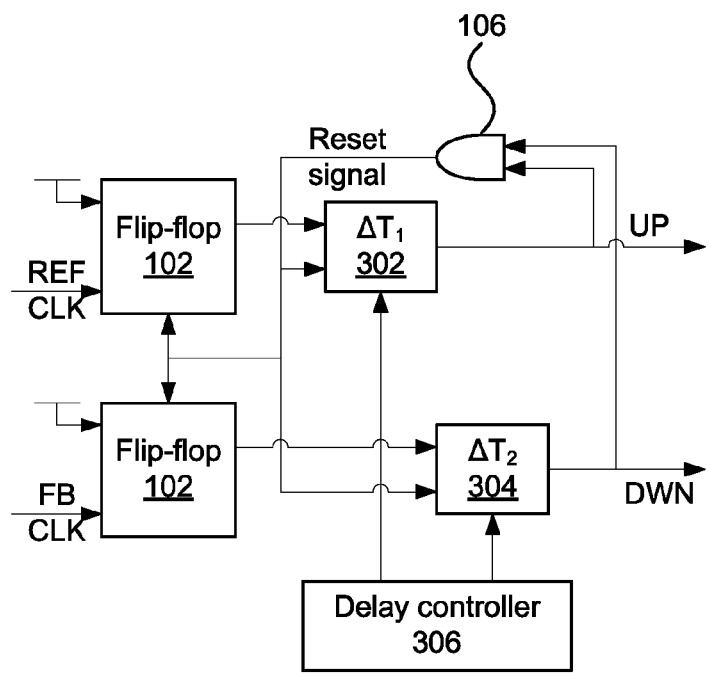
FIG. 3 is a diagram illustrating a delay module in accordance with the present principles.

Referring now to FIG. 3, additional detail on one embodiment of the programmable delay module 104 is shown. The delay module 104 includes a set of delay modules 302 and 304 and a delay controller 306. The delay controller is a synchronous digital block that calculates the deterministic error caused by the sigma-delta module 114 and applies appropriate control settings to the delay modules 302 and 304. The delay controller 306 can reconfigure the delays for each set of clock edges. In this embodiment, each delay element 302 and 304 are independently controllable. As feedback and reference phase signals come from the latches 102, the delay controller sets a delay for each line. However, manufacturing process variations can cause the two delay elements 302 and 304 to differ, such that additional gain calibration may be needed.

Figure 4:
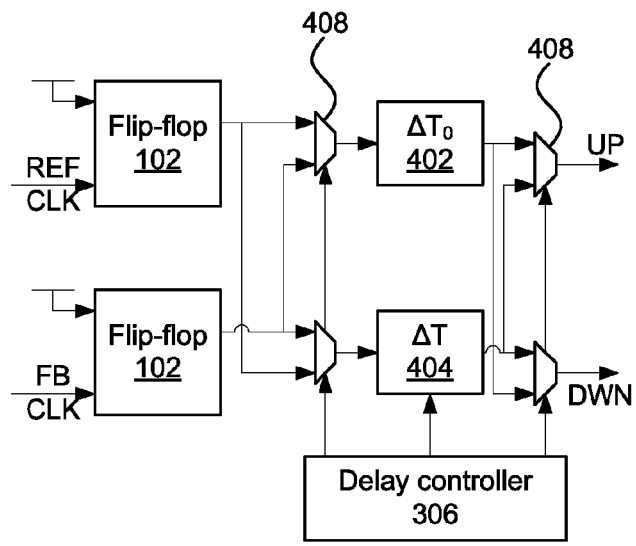
FIG. 4 is a diagram illustrating a delay module in accordance with the present principles.

Referring now to FIG. 4, an alternate embodiment of the programmable delay module 104 is shown. In this embodiment, the two programmable delays 302 and 304 are replaced by a fixed delay 402 and a single programmable delay line 404, where the delay controller 306 uses selectors 408 to put the programmable delay 404 on the path of the signal to be delayed. Note that the reset lines have been omitted from this figure for the sake of clarity. The fixed delay 402 has a delay which replicates the minimum achievable delay of the programmable delay line 404. The fixed delay 402 thereby keeps the two paths balanced, as the programmable delay 404 will always have some small propagation delay, even when the delay is set to be at its minimum.

Figure 5:
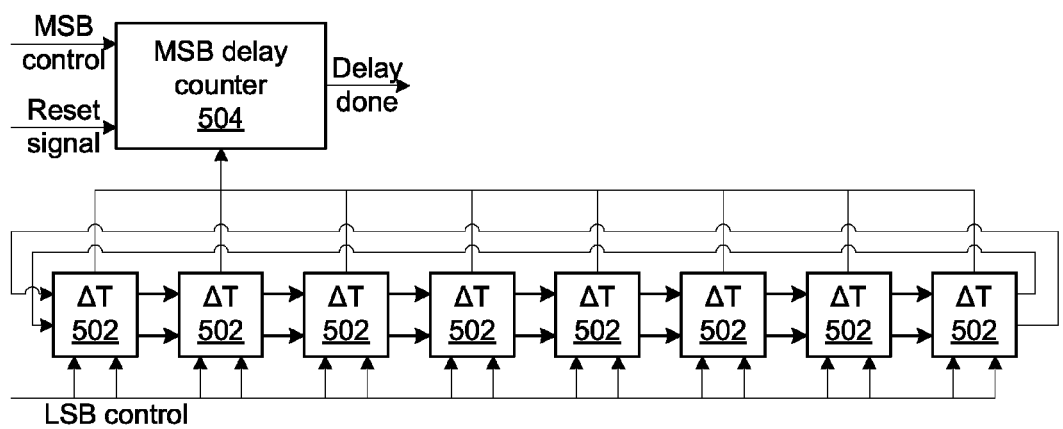
FIG. 5 is a diagram illustrating a programmable delay line in accordance with the present principles.

Referring now to FIG. 5, a diagram of a programmable delay line 302/402 is shown. A set of eight differential unit delay elements 502 is provided in a linear arrangement, such that the delayed output of a first delayed element 502 is provided as the input to the next element. All but one of the connections between consecutive delay elements are non-inverting connections. One connection is inverting, as would be the case in a conventional ring oscillator. Each unit delay element 502 produces two sets of outputs, namely, one set that goes directly to the next stage, and one set that goes through a tri-state buffer. The tri-state buffer can be used to connect either of the differential outputs of the individual unit delay elements to the output clock of the first stage. As there are 8 units in the delay cell each with a differential output, there are a total of 16 tri-state buffers. At any time only 1 of the 16 tri-state buffers will be enabled. Thus the output of the ring can be tapped from one of 16 positions. A delay control word is provided to select a starting point based on a least significant bit (LSB) for the desired delay. The LSB delay control determines which of the delay elements will be tapped to indicate that a cycle has elapsed. LSB delay control signals may also be used to set an initial state for the delay elements 502 and to initiate oscillation upon receipt of a start signal.

Between sets of PLL reference and feedback edges, after the UP/DWN pulses have been generated, and after the programmable delay line 302/402 has been reset, the ring is disabled. During the disabled period, the ring is reconfigured so that, once enabled, the first rising edge at the output of the ring will occur between one and sixteen unit delays after the ring is enabled, with each successive rising edge occurring with a delay of sixteen units as the rising edge traverses the loop. The output of the ring clocks the MSB counter 504, which has been initialized such that it will produce an output after N rising edges at its input, where N is the programmed count value.

Each of the delay elements 502 outputs to MSB counter 504, which counts a number of cycles in accordance with an MSB control signal. The first signal that arrives at the MSB counter 504 represents the time set by the LSB, with subsequent signals representing a full sixteen units of delay. The LSB step size is set by a single element of the ring and its minimum size is determined by the underlying manufacturing process. Once the MSB counter 504 has counted the number of cycles prescribed by the MSB control signal, the MSB counter 504 outputs that it is finished, producing the UP or DOWN signal as appropriate.

Figure 6:
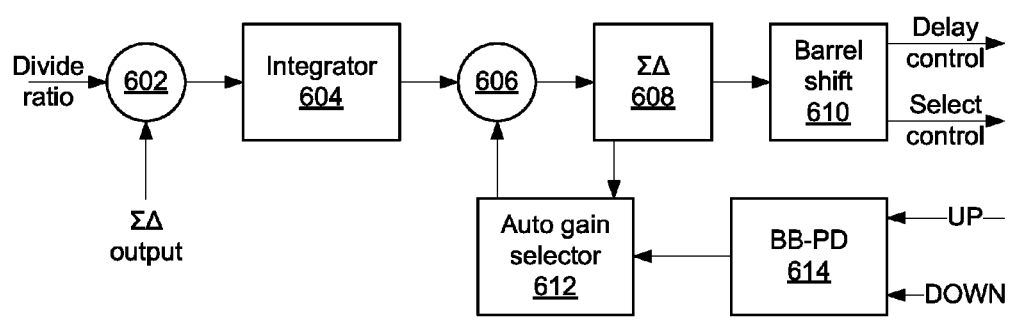
FIG. 6 is a diagram illustrating a delay control module in accordance with the present principles.

Referring now to FIG. 6, a detailed diagram of delay controller 306 is shown. A subtractor 602 receives as inputs the fractional divide ratio and the quantized output of the sigma-delta module 114 to find the magnitude of the instantaneous frequency error. An integrator 604 turns this instantaneous frequency error into a phase error which is then multiplied by a gain factor using a digital multiplier 606. A sigma-delta module 608 provides for delay resolution below the level of a single delay element 502 and a barrel shift 610 controls the programmable delay line 404 and the selectors 408. A bang-bang phase detector 614 receives the UP and DWN signals from the selectors 408 and provides a phase direction to an automatic gain selector 612.

There are limitations to the resolution of the delay loop due to the practical limitations of the manufacturing technique used. For example, the programmable delay is quantized to the delay length of a unit delay element 502. To address this, an additional sigma-delta module 608 may be used to shape the frequency spectrum of the resulting quantization noise to high frequency such that the quantization noise is filtered out by the loop filter before reaching the PLL output. The quantization noise caused by this new delta loop will be orders of magnitude smaller than the noise of the divider sigma-delta 114, as the quantization step size is much smaller.

The automatic gain selector 612 corrects for gain variation in the delay path due to process, voltage, and temperature variations. The bang-bang phase detector 614, in conjunction with the residue from the sigma-delta module 608, is used to automatically calculate if the gain is too small or too big. The automatic gain selector 612 operates by detecting if there is a correlation between the residue of the sigma-delta module 608 and the result of the bang-bang phase detector 614. A positive or negative correlation indicates that the gain is too small or large, respectively.

One further issue is that there may be mismatch between the delay elements 502 due to the use of small logic elements. Mismatch between the elements in the ring may be addressed with a dynamic element matching scheme. The barrel shift 610 forces the long term average number of times that each individual delay element 502 is used to be the same for all of the elements. The barrel shift 610 works by rotating the starting point of the ring, such that when delaying one of the two paths, the first element used for each delay for a given path is the element following the last element used on that path.

Figure 7:
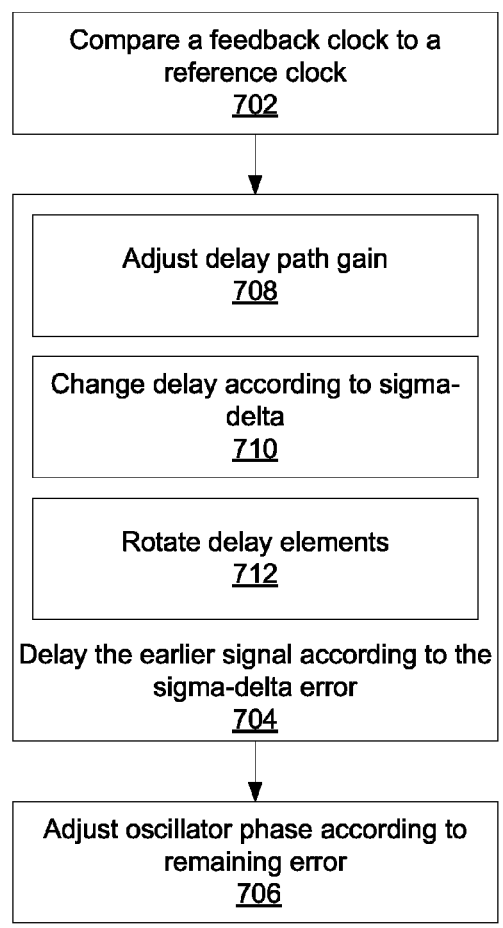
FIG. 7 is a block/flow diagram of a method for phase error correction in accordance with the present principles.

Referring now to FIG. 7, a block/flow diagram of a system/method for compensating for deterministic phase error in an analog PLL is provided. Block 702 compares the feedback clock to the reference clock at, e.g., latches 102. This block produces the signals DWN_A and UP_A, and block 704 delays the earlier of these two signals using, e.g., programmable delay module 104. Block 706 then removes the remaining phase error by applying the delayed UP/DWN signals to charge pump/filter 108 which controls the VCO 110.

The delay block 704 may include further refinements such as adjusting the delay path gain 708 to adjust for process, voltage, and temperature variations, changing the delay length according to a sigma-delta module 608 to achieve sub-element delay resolution at block 710, and rotating delay elements at block 712 with a barrel shift 610 to account for delay element mismatch.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method for removing deterministic phase errors from fractional-N PLLs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:
1. A phase-locked loop, comprising:
a phase detector, configured to compare a reference clock and a feedback clock and to generate two output signals, wherein a difference in time between pulse widths of the two output signals corresponds to a phase difference between the reference clock and the feedback clock;

a programmable delay line, configured to delay an earlier output signal in accordance with a predicted deterministic phase error;

an oscillator configured to generate a feedback signal in accordance with the delayed output signal; and a divider configured to divide a frequency of the oscillator output by an integer N, wherein the integer N is varied to achieve an average fractional divide ratio and wherein the predicted deterministic phase error is based on the average divide ratio and an instantaneous divide ratio.

2. The phase-locked loop of claim 1, wherein the predicted deterministic phase error is based on a difference between the average divide ratio and the instantaneous divide ratio.

3. The phase-locked loop of claim 1, wherein the programmable delay line comprises a fixed delay module and a programmable delay module, wherein a signal input to the programmable delay module is selected as the signal having a greater delay.

4. The phase-locked loop of claim 3, wherein the fixed delay module has a fixed delay period that corresponds to a minimum programmable delay of the programmable delay module.

5. The phase-locked loop of claim 1, wherein the programmable delay line comprises a first programmable delay module and a second programmable delay module, wherein each of said programmable delay modules is configured to delay a respective one of the two signals.

6. The phase-locked loop of claim 1, wherein the programmable delay line comprises at least one programmable delay module, each of said programmable delay modules comprising:

a plurality of individual delay units arranged in a ring, wherein output signals from a last delay unit are provided as inputs to a first delay unit; and a counter configured to provide a delayed output signal after a number of cycles of the plurality of individual delay units that corresponds with the predicted deterministic phase error.

7. The phase-locked loop of claim 6, wherein a least significant bit of the predicted deterministic phase error is accounted for by selecting a delay unit in the ring to begin an oscillation and wherein a most significant bit of the predicted deterministic phase error is accounted for by selecting a count for the counter to reach.

8. The phase-locked loop of claim 1, further comprising a delay controller configured to control the programmable delay line, said delay controller comprising an integrator configured to measure a predicted deterministic phase error from a difference between the average fractional divide ratio and the instantaneous divide ratio.

9. The phase-locked loop of claim 8, wherein the delay controller further comprises a barrel shift configured to incrementally shift a starting delay unit in the programmable delay line.

10. The phase-locked loop of claim 8, wherein the delay controller further comprises:

a bang-bang phase detector configured to detect a polarity of phase error;

a sigma-delta module configured to shape a quantization error; and a gain selector configured to determine a gain of the predicted deterministic phase error in accordance with the bang-bang phase detector and the sigma-delta module.

11. A phase correction method, comprising:

comparing a reference clock and a feedback clock to generate two output signals, wherein a difference in time between pulse widths of the two signals corresponds to a phase difference between the reference clock and the feedback clock;

delaying an earlier output signal in accordance with a predicted deterministic phase error;

generating a feedback signal in accordance with the delayed output signal; and dividing a frequency of the feedback signal by an integer N, wherein the integer N is varied to achieve an average fractional divide ratio and wherein the predicted deterministic phase error is based on the average divide ratio and an instantaneous divide ratio.

12. The method of claim 11, wherein the predicted deterministic phase error is based on a difference between the average divide ratio and the instantaneous divide ratio.

13. The method of claim 11, further comprising delaying a later signal by a fixed delay, wherein delaying the earlier signal comprises delaying by a programmable delay.

14. The method of claim 13, wherein the fixed delay has a delay that corresponds to a minimum delay of the programmable delay.

15. The method of claim 11, wherein delaying the earlier signal comprises:

triggering a ring of delay units, wherein output signals from a last delay unit are provided as inputs to a first delay unit;

counting a number of cycles of the ring of delay units; and providing a delayed output signal after a number of cycles that corresponds with the predicted deterministic phase error.

16. The method of claim 15, wherein delaying the earlier signal further comprises:

selecting a delay unit in the ring to begin an oscillation that accounts for a least significant bit of the predicted deterministic phase error; and selecting a count for the counter to reach that accounts for a most significant bit of the predicted deterministic phase error.

17. The method of claim 11, wherein delaying the earlier signal further comprises measuring a predicted deterministic phase error by integrating a difference between the average fractional divide ratio and the instantaneous divide ratio.

18. The method of claim 11, wherein delaying the earlier signal further comprises incrementally shifting a starting delay unit in a programmable delay line.

19. The method of claim 11, wherein delaying the earlier signal further comprises:

detecting a direction of phase error;

shaping a quantization error; and determining a gain of the predicted deterministic phase error in accordance with the phase error direction and the shaped quantization error.

20. A phase correction method, comprising:

comparing a reference clock and a feedback clock to generate two output signals, wherein a difference in time between pulse widths of the two signals corresponds to a phase difference between the reference clock and the feedback clock;

delaying an earlier output signal by a programmable delay in accordance with a predicted deterministic phase error, comprising:

triggering a ring of delay units, wherein output signals from a last delay unit are provided as inputs to a first delay unit;

counting a number of cycles of the ring of delay units; and providing a delayed output signal after a number of cycles that corresponds with the predicted deterministic phase error;
delaying a later signal by a fixed delay that corresponds to a minimum programmable delay for the earlier signal;
generating a feedback signal in accordance with the delayed output signal; and
dividing a frequency of the feedback signal by an integer N, wherein the integer N is varied to achieve an average fractional divide ratio and wherein the predicted deterministic phase error is based on the average divide ratio and an instantaneous divide ratio.

* * * * *